United States Patent [19]

Dooley

[11] 4,379,285
[45] Apr. 5, 1983

[54] ANALOG TO DIGITAL CONVERTER

[76] Inventor: Daniel J. Dooley, 21193 Deepwell Ct., Saratoga, Calif. 95070

[21] Appl. No.: 266,908

[22] Filed: May 26, 1981

[51] Int. Cl.³ .......................................... H03K 13/09
[52] U.S. Cl. .............................................. 340/347 AD
[58] Field of Search ................................ 340/347 AD

[56] References Cited

U.S. PATENT DOCUMENTS

| 2,832,827 | 4/1958 | Metzger | 340/347 AD |
| 4,023,160 | 5/1977 | Kirschner | 340/347 AD |
| 4,282,515 | 8/1981 | Patterson | 340/347 AD |

Primary Examiner—C. D. Miller
Attorney, Agent, or Firm—Philip M. Shaw, Jr.

[57] ABSTRACT

An analog to digital conversion circuit of the stage by stage, successive approximation type which incorporates a plurality of cascaded stages. Each stage comprises a mirror current generator for generating first and second mirror currents of the same magnitude as the input current, means for generating a reference current whose magnitude is one half of the full scale current range of the overall conversion circuit, and comparator means connected to the mirror current generator and to the reference current generator for comparing the magnitude of the first mirror current with the magnitude of the reference current and for generating a first binary output signal, as well as a stage output signal which is twice the magnitude of the difference of the first mirror current and the reference current, when the magnitude of the first mirror current is less than the magnitude of the reference current and for generating a second binary output signal as well as a stage output signal having twice the magnitude of the first mirror current, when the magnitude of the first mirror current is less than that of the reference current.

7 Claims, 4 Drawing Figures

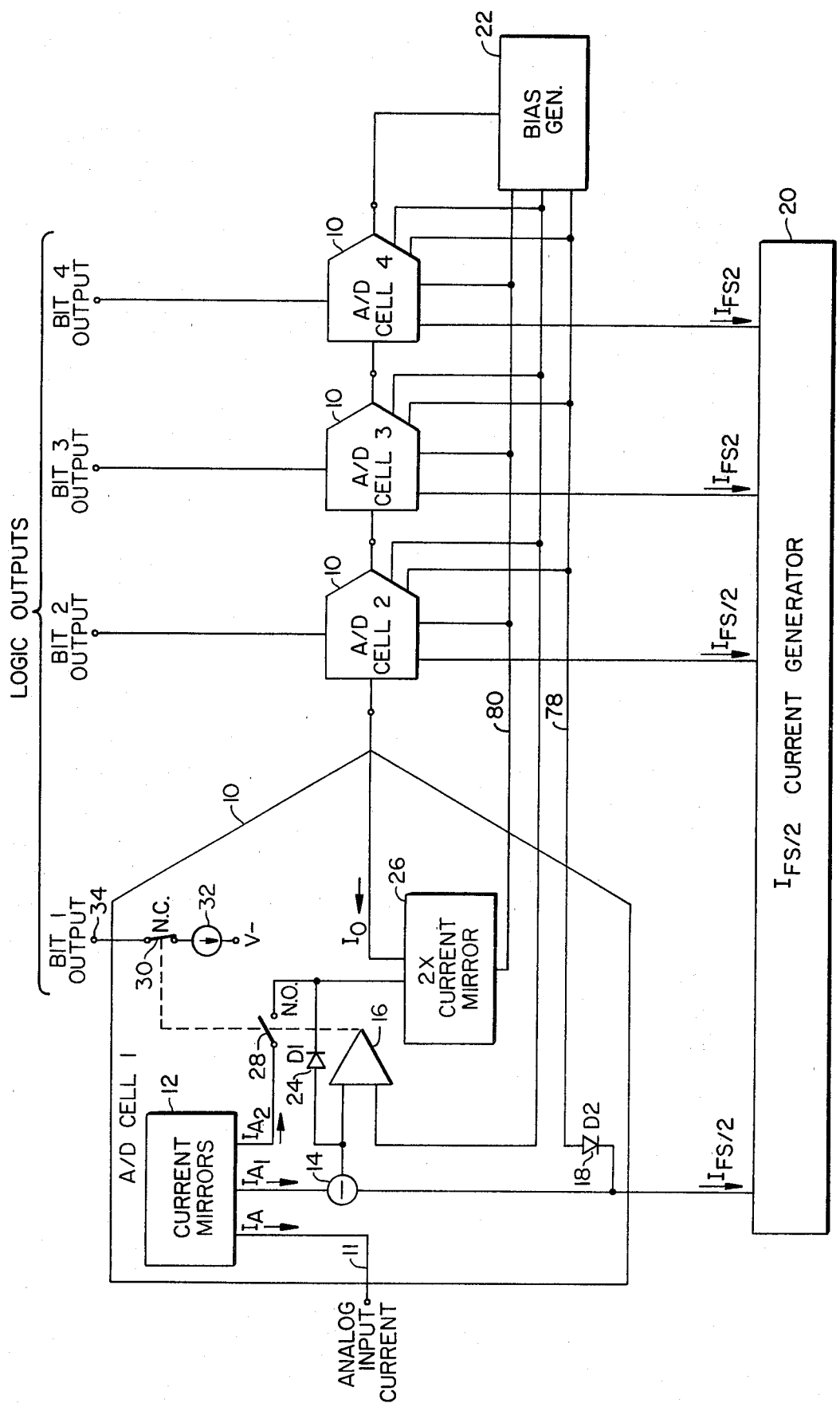
FIG._1.

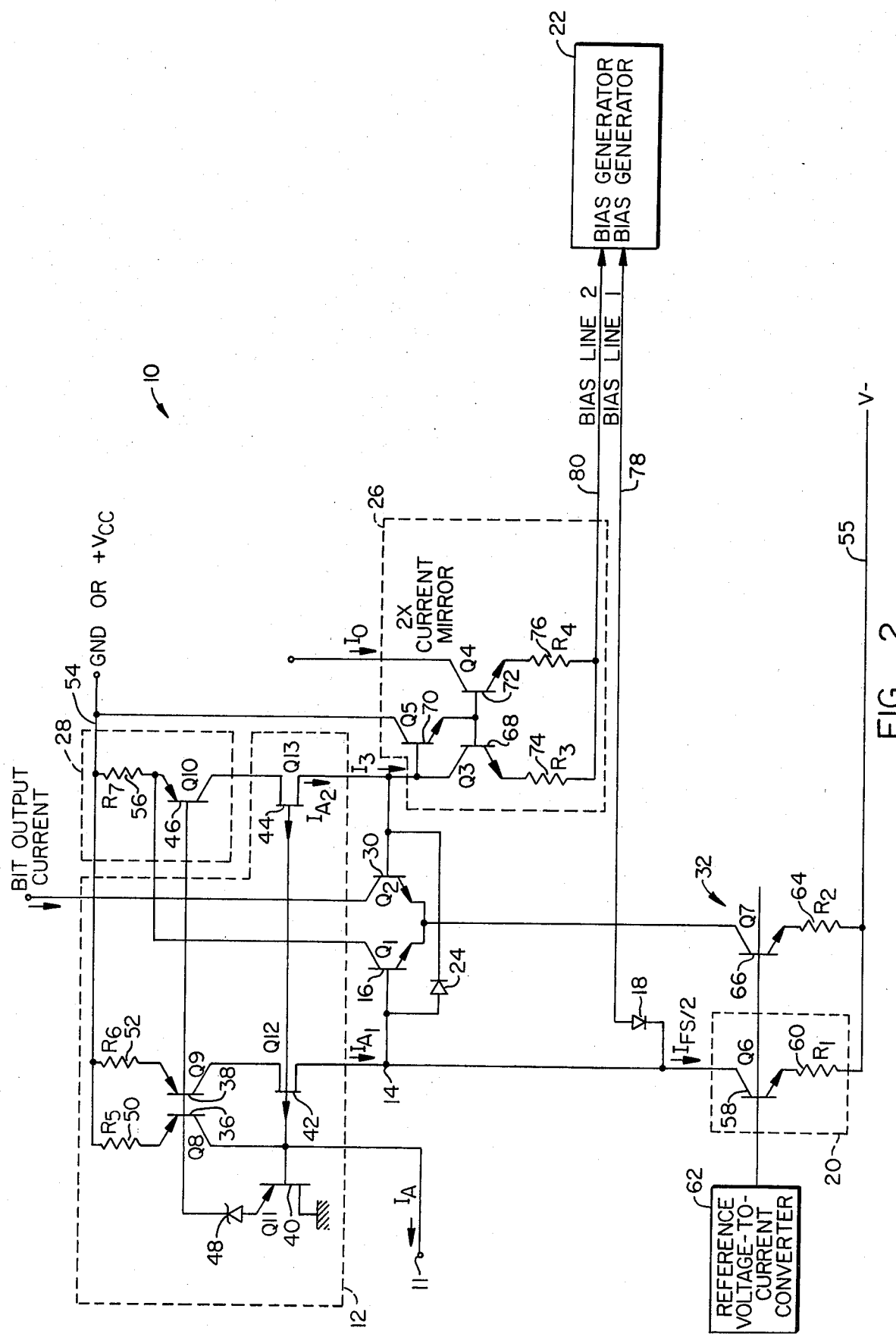
FIG._2.

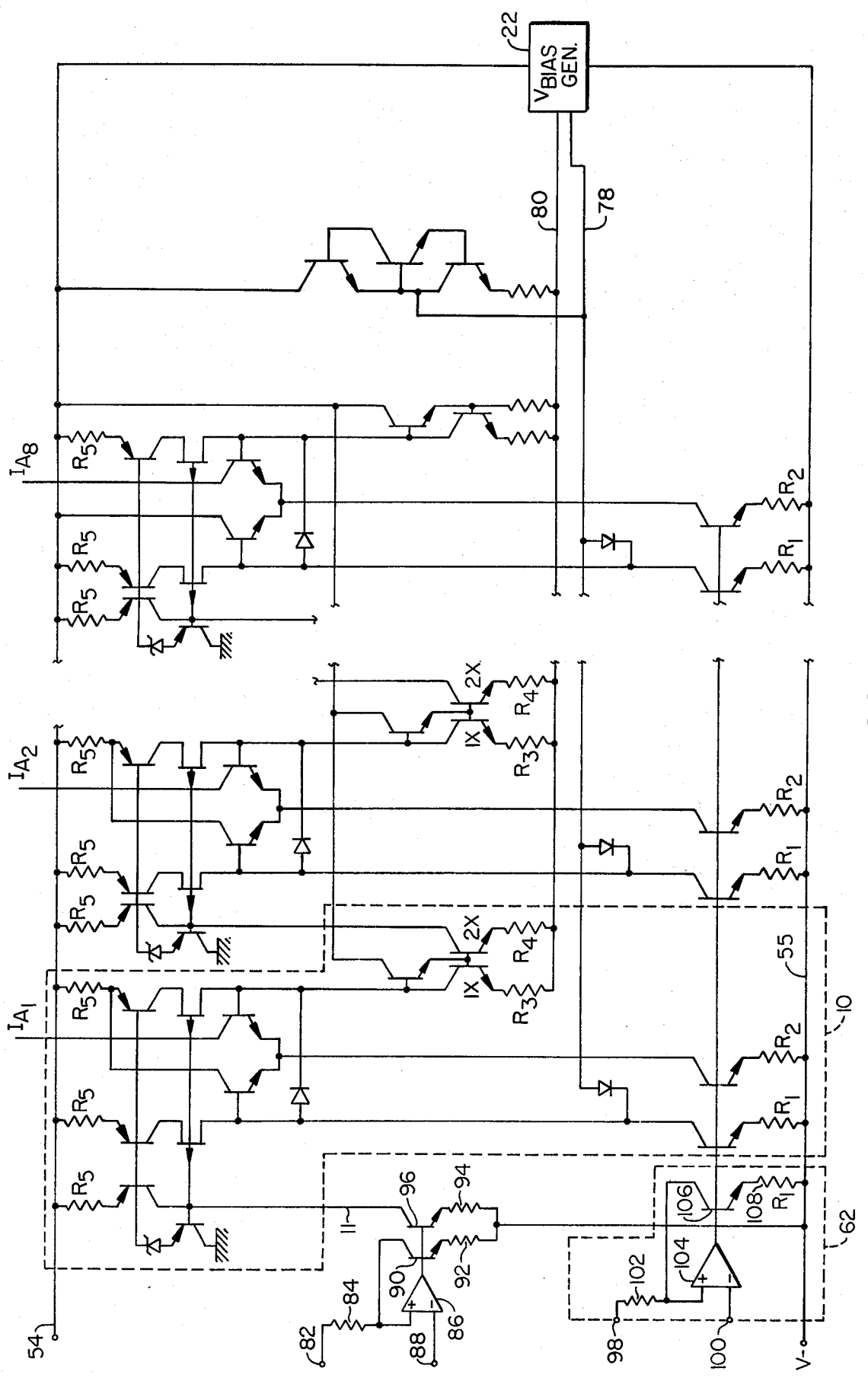
FIG._3.

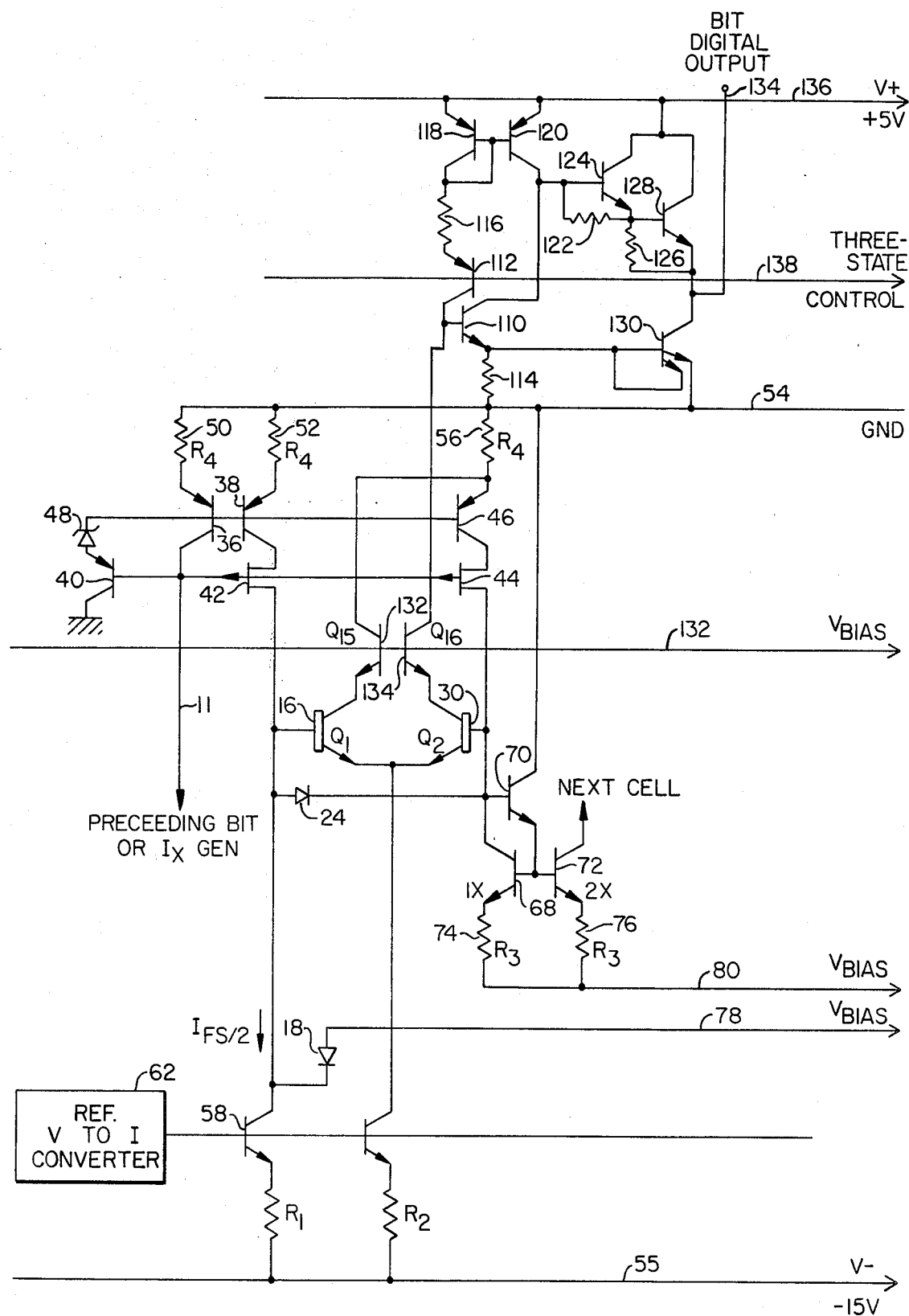
FIG._4.

ANALOG TO DIGITAL CONVERTER

BACKGROUND OF THE INVENTION

This invention relates to analog to digital converters and more particularly to an A/D converter of the stage by stage, successive approximation type.

To interface data processing systems with the real world, an A/D converter is required to perform measurement and a digital to analog converter is required to perform control. A/D converters can be grouped into four classes; namely, feedback, integrating, parallel and cascade. All of these various classes of A/D converters have certain properties which dictate their respective applications.

This invention is concerned with the feedback class of A/D converter and, more particularly, with the successive approximation sub-type. In such a converter, the analog input is successively compared against each weighted bit until the analog input has been approximated by the digital code. Generally, this is a binary code and will require the same number of trials (comparisons) as the number of bits of resolution the converter has; i.e., a 12 bit converter requires 12 successive trials to make a complete conversion. This type of shift-sequenced-feedback successive approximation is well known.

Not as well known is a successive approximation technique instrumented by a succession of identical stages called a stage-by-stage architecture. The key features of this approach are that each cell or stage is identical, and a higher through put rate can be attained. This is because it is not necessary to settle to the same degree of precision at each decision. Each analog stage effectively subtracts half of full-scale from its input and makes a decision via a comparator as to whether the input signal is higher or lower than that reference. The difference is then gain multiplied by a factor of 2, and the absolute value of the amplified difference is passed on to the next stage.

This approach also has an advantage in that the digital logic circuitry required is greatly reduced over the shift-sequenced-feedback architecture. The analog circuitry contained within the blocks, however, is not easily realized in integrated circuit form, and can be a major error source, thereby limiting the accuracy which can be achieved in the converter.

What is needed is an A/D converter of the stage by stage, successive approximation type which can be easily synthesized in integrated circuit form without introducing major error sources and with a minimum number of components required to realize the function.

SUMMARY OF THE INVENTION

The foregoing disadvantages of prior art A/D converters are overcome by the present invention of an analog to digital conversion circuit of the stage by stage, successive approximation type wherein at least the initial stage comprises mirror current means for receiving an analog input current and for generating a first mirror current of the same magnitude as the magnitude of the input current, reference current means for generating a reference current whose magnitude is one-half of the full scale current range of the conversion circuit, and comparator means connected to the mirror current means and to the reference current means for comparing the magnitude of the first mirror current with the magnitude of the reference current and for generating a first binary output signal, as well as a stage output signal which is twice the magnitude of the difference of the first mirror current and the reference current, when the magnitude of the first mirror current is less than the magnitude of the reference current and for generating a second binary output signal as well as a stage output signal having twice the magnitude of the first mirror current, when the magnitude of the first mirror current is less than that of the reference current.

In the preferred embodiment, the conversion circuit of the invention comprises a plurality of such stages with the input current to each stage subsequent to the initial stage being the stage output signal of the preceding stage. In this embodiment, the mirror current means actually generates a first and a second mirror currents of the same magnitude as the magnitude of the input current and the comparator means includes a 2X current generator which generates a stage output current having twice the magnitude of the input current received by it. The comparator means, upon sensing that the magnitude of the first mirror current exceeds that of the reference current, causes the second mirror current to be fed to the 2X mirror means in order to produce the twice magnitude stage output current.

The design of the stages in the present invention eliminates digital circuitry as well as the absolute value circuitry required in each cell in prior art devices. It is therefore an object of the present invention to provide an analog to digital converter which minimizes the amount of analog circuitry contained within each stage of the A/D converter. It is another object of the invention to provide an A/D converter which is easily realized in integrated circuit form.

It is yet another object of the invention to provide an A/D converter which is highly accurate.

The foregoing and other objectives, features and advantages of the invention will be more readily understood upon consideration of the following detailed description of certain preferred embodiments of the invention, taken in conjunction with the accompanying drawings.

BRIEF DESCRIPTION OF THE DRAWINGS

FIG. 1 is a block diagram of the A/D converter circuit according to the invention;

FIG. 2 is a detailed schematic circuit diagram of one stage of the A/D converter circuit depicted in block form in FIG. 1;

FIG. 3 is a detailed schematic diagram of an eight stage A/D converter according to the invention; and FIG. 4 is a detailed schematic circuit diagram of a modified embodiment of one stage of the A/D converter circuit according to the invention.

DETAILED DESCRIPTION OF THE PREFERRED EMBODIMENTS

Referring now in particular to FIG. 1, the operation of the iterative cell A/D converter can best be understood by tracking the series of responses to a given input stimuli through the block diagram depicted. The analog input signal to be digitized is first transformed to a current $I_A$ using well understood circuit techniques. This input current $I_A$ is applied to the input terminal 11 of the initial stage 10. As indicated by the arrow in the figure, the input current has a negative polarity. This input current is supplied to the input of a first current mirror generator 12 which produces two output currents $I_{A1}$ and $I_{A2}$ whose magnitudes and polarities are the same as that of the input current $I_A$. The first mirror current $I_{A1}$ is connected to a node 14 which is also connected to one input of a comparator 16 and the cathode of a diode 18. The anode of the diode 18 is connected via a line 78 to a bias generator 22 which is a substantially ideal voltage source.

The output of a reference current generator 20 is also connected to the node 14. The reference current generator 20 produces an output current which is equal to one-half of the full scale range ($I_{FS/2}$). The polarity of this current is opposite to the polarity of the current $I_{A1}$.

Also connected to the node 14 is the anode of a diode 24. The cathode of diode 24 is connected to the input of a 2X current mirror 26, i.e. it produces an output current $I_O$ which is twice the magnitude of the input current.

The second mirror current $I_{A2}$ is supplied through a switch 28, which is normally open, to the input of the 2X current mirror 26. A second switch 30, which is normally closed, is connected between the output of bit current generator 32 and a bit output terminal 34. The operation of the switches 28 and 30 is controlled by the comparator 16.

Each one of the stages or cells of the A/D converter is substantially identical to this initial cell and has corresponding connections to the reference current generator 20 and to the bias generator 22. The output of the initial cell 10 is supplied to the input of the second cell and the output of each succeeding cell or stage is supplied to the input of the next succeeding cell or stage.

In operation, if the value of the input current $I_A$, and hence $I_{A1}$, is greater than $I_{FS/2}$, the voltage potential at node 14 will rise, thereby forward biasing diode 24 and turning it on, i.e. it becomes conductive. The output of the comparator 16 will be in such a state that the switch 28 will remain on and the switch 30 will remain closed. Therefore, a logical "1" decision has been made on bit 1. That is, the current ($I_{A1}-I_{FS/2}$) flows through diode 24 to the input of the 2X current mirror 26. The output of the 2X current mirror 26 becomes twice the remainder current which becomes the input analog signal for the second stage.

If the analog input current, and hence $I_{A1}$, is smaller in magnitude than $I_{FS/2}$, then the voltage at the node 14 will decrease in magnitude. Diode 24 thereby is made non-conductive, and diode 18 is made conductive. The difference current, ($I_{FS/2}-I_{A1}$), flows through the clamp diode 18 from the bias generator 22 such that the sum of the current at the node 14 is $I_{FS/2}-I_{A1}+I_{A1}-I_{FS/2}$, therefore satisfying Kirchoff's Law. Since the voltage at node 14 decreases in value, the output of the comparator 16 changes state; thereby closing switch 28 and opening switch 30. Again the correct logical decision has been made for a logic output of "0". This satisfies the condition that $I_A$ is less than $I_{FS/2}$.

Since there is no current flowing through diode 24, and switch 28 is closed, the current applied to the input of the current mirror 26 is $I_{A2}$ which is equal in value to the analog input current $I_A$. Therefore, the output of the first cell is now twice the magnitude of the input current ($I_O=2I_A$) and this is applied to the input of the next cell.

To summarize the operation of the cell, first a difference is made between the analog input current and a current equal to one-half the full scale range ($I_{A1}-I_{FS/2}$). If the result is greater than or equal to 0, the difference current is multiplied by a factor of two and is applied to the next cell. Furthermore, the logic output is a "1" representing the logical decision made for this condition.

If the difference ($I_{A1}-I_{FS/2}$) is negative, the result is discarded and the original analog signal is applied to the input of the 2X multiplier circuit 26. The analog output would then be $2I_A$ and the logic output would be a "0". This operation is then repeated for each cell.

A detailed circuit description of the A/D converter of the invention will now be given in reference to FIG. 2. The input terminal 11 is connected, as mentioned, to the input of a dual mirror current generator 12. The generator 12 is comprised of PNP transistors 36, 38, 40 and 46 and P-channel field effect transistors 42 and 44. The drains of transistors 42 and 44 form the two outputs of the current mirror 12. The current $I_{A1}$ is generated at the drain of the transistor 42 and the current $I_{A2}$ is generated at the drain of the transistor 44.

The input terminal 11 is therefore, connected to the base of transistor 40, the gates of transistors 42 and 44 and the collector of transistor 36. The collector of transistor 40 is connected to the circuit ground or V−. Its emitter is connected to the anode of a Zener diode 48. The cathode of the diode 48 is connected to the bases of the transistors 36, 38 and 46. As will be explained later herein, the transistor 46, together with a resistor 56, constitute the switch 28.

The source terminal of the transistor 42 is connected to the collector of transistor 38. Likewise the source of the transistor 44 is connected to the collector of the transistor 46. The emitters of the transistors 36, 38 and 46 are connected through separate resistors 50, 52 and 56, respectively, to a bias line 54 which is connected to the ground or to a $+V_{CC}$ voltage source. Note that the transistor 44 is switched depending on the current flowing through transistor 46.

Zener diode 48 and transistor 40 are used to keep a constant gate-to-source voltage on the transistors 42 and 44, to minimize errors and to increase the precision of the current mirror.

The reference current source 20 is comprised of an NPN transistor 58 and a resistor 60. The collector of the transistor 58 is connected to the node 14 and the emitter of the transistor 58 is connected through the resistor 60 to a −V voltage source line 55. The base of the transistor 58 is connected through a reference voltage-to-current converter 62.

The comparator is comprised of a NPN transistor 16 whose emitter electrode is connected to the collector of an NPN transistor 66. The emitter of transistor 66 is connected through a resistor 64 to the −V voltage source 55. The base terminal of transistor 66 is also connected to the reference voltage-to-current converter 62. The transistor 66 and the resistor 64, in effect, comprise the bit current generator 32.

Node 14 is connected to the base of the transistor 16, and the collector of transistor 16 is connected to the emitter of the transistor 46. Thus, when the voltage at the node 14 rises because the current $I_{A1}$ is greater than the half full scale reference current ($I_{FS/2}$), the diode 24 becomes forward biased, and thus conductive, and transistor 16 also becomes conductive. This causes the potential at the emitter of the transistor 46 to drop, thereby shutting off the transistor 46 so that the current $I_{A2}$ does not flow through transistor 44.

The switch 30 is comprised of an NPN transistor (referenced 30) whose emitter is connected to the collector of the transistor 66. The collector of the transistor 30 constitutes the bit output terminal. In this embodiment, the bit output is a complementary output. The base terminal of the transistor 30 is connected to the drain of transistor 44.

The 2X current mirror 26 is comprised of three NPN transistors 68, 70 and 72 and two resistors 74 and 76. The collector of the transistor 68 and the base of the transistor 70 are connected to the drain electrode of transistor 44 and to the cathode of the diode 24. The emitters of the transistors 68 and 72 are connected through the resistors 74 and 76, respectively, to a line 80 of the bias generator 22. The emitter of transistor 70 is connected to the bases of the transistors 68 and 72. The collector of the transistor 70 is connected to the line 54 and the collector of the transistor 72 is the stage output terminal.

The reference source generator 20 has an output current ($I_{FS/2}$) which is set to one-half of the allowable full scale analog input current which can be converted by the circuit. This output current is polarized to flow into the collector of transistor 58. The voltage applied to the base of transistor 58 is determined by the reference circuit 62, to be described in greater detail hereafter, which will compensate $V_{BE}$ temperature variations and base current error. The approach to this compensation is well understood by those skilled in the art.

The 2X current multiplier of current mirror 26 formed by the transistors 68, 70 and 72 and the resistors 74 and 76 is made possible by the well known technique of scaling. Using this technique, transistor 72 is area scaled to have an emitter area which is twice the emitter area of transistor 68. The resistors 74 and 76 increase the output impedance of the current mirror, and make error adjustments possible. Transistor 70 increases the output precision and compensates the base current errors of transistors 68 and 72. Voltage supplied by the bias generator 22 on line 80 is taken in relationship to the clamp voltage supplied on line 78 to the anode of the diode 18.

The operation of the single stage is best understood by tracing the effects at each point in the circuit to a given input stimulus. First, assume an analog input current $I_A$ is applied to terminal 11 which is less than $I_{FS/2}$. The input current to be digitized is mirrored to two outputs of the current mirror 12, that is, the drain electrodes of transistors 42 and 44. At node 14, since $I_{A1}$ is less than the reference current source $I_{FS/2}$, the node 11 be pulled negative in voltage by the reference current source 20 until diode 18 becomes forward biased and clamps the node to one diode forward voltage drop below the voltage at bias line 78. The difference current ($I_{FS/2} - I_{A1}$) will flow through diode 18 from the bias generator 22.

With node 14 falling in voltage potential, transistor 16 and diode 24 become nonconductive and transistor 30 becomes conductive. The tail current will flow in the bit output current and will be considered a logical "1". Since transistor 16 is turned off the second output ($I_{A2}$) of the current mirror 12 at the drain of transistor 44 is on and will flow into the input of the 2X current mirror 26 at the collector of transistor 68. The resulting analog output of the stage will be $2(I_A)$ and this will be supplied as the input to the next cell. The logical decision made was a "1" in the complementary binary format.

Assume now the condition that the analog input current is greater than $I_{FS/2}$. At node 14 the voltage will rise positively thereby causing diode 18 to become nonconductive and diode 24 to become conductive. The difference current ($I_{A1} - I_{FS/2}$) will flow through diode 24 to the input to the 2X current generator 26, that is the collector of transistor 68. Node 14 will rise to a positive voltage equal to $V_{Bias\ Line\ 80} + I_{R74}R_{74} + V_{BE68} + V_{BE70} + V_{D24}$ Where $I_{R74}$=current flowing through resistor 74, $R_{74}$=resistance of resistor 74
$V_{BE68}$=base-emitter voltage of transistor 68
$V_{BE70}$=base-emitter voltage of transistor 70
$V_{D24}$=voltage drop across diode 24.

Transistor 16 will be turned on and transistor 30 will be turned off. Therefore the digital output bit current will be zero and the correct logical decision of "0" will have been made. Because the tail current is much much greater than $I_{FS/2}$ and is flowing through transistor 16, the voltage drop across resistor 56 will increase, thereby turning off transistor 46. When this happens, $I_{A2} = 0$ and the only current flowing into the 2X multiplier is the difference current ($I_{A1} - I_{FS/2}$) through diode 24. Therefore the analog output is correctly given as $2(I_{A1} - I_{FS/2})$. This output becomes the input to the next cell.

Each cell or stage will operate in either of these two modes depending on the value of the analog input signal. Note that the basic logical decision, 2X multiplication and conditioning circuitry only require 16 active structures and 7 passive elements, making this one of the simplest A/D cells to date.

The tail current source for the current comparator/differential switch combination (16 and 30) and, in effect, the bit current output generator, is formed by a transistor 66 and the resistor 64. For convenience in biasing transistor 66 the base is shown connected to the compensated reference line of the reference-to-voltage converter 62. This is not absolutely necessary since the current is not critical, but it is convenient in integrated circuit topology and provides for simplicity of interconnections. As will be discussed later herein the only constraint on the tail current is that it be greater than the analog input current.

There are several distinct advantages of the A/D converter circuit of the invention:

1. Simplicity—There are only 16 active structures and 7 passive elements per cell.
2. The maximum of 2:1 geometry scaling on both active and passive device scaling.
3. Optimized speed-power tradeoffs.
4. Easily trimmed for optimizing accuracy performance.
5. Both unipolar and bipolar operation is easily obtained.

These features will now be discussed in detail. The small number of devices necessary to realize the A/D converter according to the invention permits a low manufacturing cost. Using integrated circuit technology, simplicity means that a smaller amount of silicon area is required. The advantage is threefold. First a greater yield to good devices is obtained for a given defect density. Second, more devices are available on a silicon wafer because of the smaller size; therefore multiplying the number of good devices obtained. Third, this invention permits economical expansion of function to incorporate peripheral support circuits such as multiplexers, sample-and-hold and digital logic registers.

In most common approaches to achieve A/D conversion circuitry it is necessary to scale the geometry of the active devices (transistors and diodes) and passive elements (resistors and capacitors). The purpose of this geometry scaling is to provide weighted bit currents, voltages or charges and to minimize inherent error sources due to device characteristics. For example, to achieve a 12-bit converter, the precision current source transistors must be scaled 2048:1. There are methods to reduce this degree of scaling but considerable amount of scaling is still required. For example, 32:1 is common. The control and precision of the photolithography process in determining this scaling is a major error source and ultimately is a limitation on the performance accuracy. However, controlling dimensions for 2:1 geometries can readily be achieved. This is a major advantage of the approach taken by the present invention.

All precision passive elements (resistors) also require no greater than a 2:1 scaling. In fact, the precision current references consist of identical transistor and resistor geometries thereby greatly reducing a major error source. Furthermore, each element has a constant applied voltage which further reduces a troublesome error source in conventional approaches.

The A/D cell of the present invention has optimized speedpower over other implementations by:

a. Eliminating loop propagation delays by eliminating the overall feedback loop.
b. Reducing the precision required to settle at most decision points (inherent in a stage-by-stage approach).
c. Constraining the maximum voltage swing at any node to be less than or equal to plus or minus 1 $V_{BE}$. This reduces both the time to slew the node through the voltage change and reduces the current requirement necessary to charge and discharge parasitic capacitances inherent to any circuit realization. This is based on the relationship:

$$I = C\left(\frac{dv}{dt}\right).$$

Constraining the maximum voltage swing and reducing bit current for a given speed not only reduces overall power dissipation but also reduces thermal errors due to transient power dissipation.

d. Eliminating propagation delays of logic circuitry by eliminating circuit need.

Any circuit configuration and technology has basic limitations in the ultimate accuracy or precision which can be achieved. If nothing more, the process vagaries, defects, manufacturing tolerances and gradients across a silicon wafer will be the limiting factors. Therefore to increase yields and accuracy some form of trimming circuit elements for high resolution converters is preferred.

In most converter configurations the resistor ladder network is trimmed using a laser or some discrete form of trim (such as a link-blow or zener-zap) to reduce bit errors. Resistors are trimmed by increasing or decreasing their values to change the current through them. Most converter configurations use an R-2R resistor ladder to define the bit currents. This is a very difficult trim algorithm and tends to degrade temperature performance. The trim is interactive in that changing one resistor changes the voltage/current relationship at all other nodes.

By contrast, the A/D converter of the present invention permits completely independent adjustment. Referring to FIG. 2, the reference current sources can be adjusted by trimming resistors 60. The 2X current mirror 26 can be adjusted by trimming the resistors 74 or 76 and the 1X current mirror 12 can be adjusted by trimming resistors 50, 52 and 56. In each case the adjustments are completely independent and can be adjusted either to an absolute value or to matching to other cells. The adjustment technique is simpler than any existing approach.

Although adjustment to reduce error sources is easily accomplished, a key feature is reducing the need to trim at all. The identical reference resistors are easily matched and track to greater than 11-bits of accuracy using existing technology. The same is true for the remaining precision resistor elements. The scaled transistors and diodes (2:1 maximum) can also be more readily achieved than other approaches. The completely iterative cell provides optimized matching and reduced vagararies due to integrated circuit processing.

Bipolar and unipolar operation refer to being able to accept analog inputs which vary on either side of ground (0 volts or 0 current)—bipolar or in one direction only—unipolar. Since most of the system requirements use analog voltage inputs, FIG. 3 details the necessary connections to achieve both bipolar and unipolar operation of the A/D converter of the invention.

The only changes from the schematic diagram shown in FIG. 2 are that the reference voltage to current converter 62 is shown in detail and an input circuit is connected to the input terminal 11 of the first cell 10. The input circuit connected to the terminal 11 comprises a terminal 82 connected through a resistor 84 to the positive input to an operational amplifier 86. The negative input of the amplifier is connected to an input terminal 88. The output of the amplifier is connected to the base of an NPN transistor 90.

The emitter of transistor 90 is connected through a resistor 92 to the −V bias line 55. The collector of transistor 90 is connected to the positive input to the operational amplifier 86.

The output of the amplifier 86 is also connected to the base of a second NPN transistor 96 whose collector is connected to the input terminal 11 of the cell 10. The emitter of transistor 96 is connected through a resistor 94 to the bias line 55.

The reference voltage to current converter 62 has two inputs. The first is an input 98 connected through a resistor 102 to the positive input of an operational amplifier 104. The second input is a terminal 100 connected to the negative input to the amplifier 104. The output of the amplifier 104 is the output of the unit 62 and, as mentioned above, is connected to the base terminals of the transistors 58 and 66. It is also connected to the base terminal of a transistor 106 whose collector is connected to the positive input of the amplifier 104. The emitter of the transistor 106 is connected through a resistor 108 to the bias line 55.

Unipolar operation is achieved by connecting terminals 88 and 100 to the circuit ground (0 volts), terminal 98 to a positive reference voltage and using terminal 82 as the analog input. The operational amplifier 86 and the transistor 90, in a feedback loop, acts as a voltage-to-current converter and change the analog input voltage to a current which can be applied to the cell 10. This circuit technique is commonly used and well understood by those skilled in the art. Operation is limited to a unipolar voltage input because the analog input at terminal 82 can only go positive in relationship to terminal 88. Taking the input negative will turn off the operational amplifier 86 and transistor 90 so that no current will flow.

To achieve bipolar operation, an offset binary approach is used. Again referring to FIG. 3, terminal 98 is connected to the circuit ground, terminals 88 and 100 are referenced to a voltage equal to a negative full scale and terminal 82 is again the analog voltage input. Both the reference current generating circuitry formed by the operational amplifier 104 and the analog input voltage-to-current converter have been offset below ground equal to negative full scale. This maintains both voltage-to-current converters in the active region with a bipolar analog input voltage.

In all other respects the circuitry depicted in FIG. 3 limitations, and there is no intention, in the use of such terms and expressions, of excluding equivalents of the features shown and described, or portions thereof, it being recognized that various modifications are possible within the scope of the invention claimed.

What is claimed is:

1. An analog to digital conversion circuit of the stage by stage, successive approximation type, wherein at least the initial stage comprises mirror current means, including an input terminal for receiving an analog input current and for generating a first mirror current of the same magnitude as the first diode's polarity being such that the first diode is conductive when the magnitude of the first mirror current ($I_{A1}$) is greater than the magnitude of the reference current ($I_{FS/2}$) and nonconductive when it isn't, (m) the second diode is connected between the bias generator means and the node, the second diode's polarity being such that the second diode is conductive when the magnitude of the first mirror current ($I_{A1}$) is less than the magnitude of the reference current ($I_{FS/2}$) and nonconductive when it isn't, and (n) the comparator switch means is connected to sense the voltage at the node and is further connected to both supply the second mirror current to the input terminal of the 2X current mirror means only when the first diode is nonconductive and to cause the bit output signal generator means to generate the first binary output signal when the first diode is conductive, and to generate the second binary output signal when the first diode is nonconductive.

4. An analog to digital conversion circuit as recited in claim 3 wherein the anode of the first diode and the cathode of the second diode are connected to the node.

5. An analog-to-digital conversion circuit as recited in claims 1 or 3 further comprising voltage-to-current converter means connected to the input terminal for receiving an analog input voltage signal and for converting that signal into a corresponding analog input current signal which is applied to the input terminal.

6. An analog to digital conversion circuit as recited in claim 5 wherein the voltage-to-current converter means selectively accepts either bipolar or unipolar voltage inputs based upon connections to the reference voltage-to-current converter.

7. An analog to digital conversion circuit as recited in claim 3 wherein the bit output signal generator means is capable of selectively generating a binary 1, a binary zero, or no binary output based on a decision if the analog signal is less than or greater than the reference current.

* * * * *